United States Patent

Goela

[11] Patent Number: 6,042,758
[45] Date of Patent: Mar. 28, 2000

[54] PRECISION REPLICATION BY CHEMICAL VAPOR DEPOSITION

[75] Inventor: Jitendra Singh Goela, Andover, Mass.

[73] Assignee: CVD, Inc., Woburn, Mass.

[21] Appl. No.: 09/072,957

[22] Filed: May 5, 1998

[51] Int. Cl.[7] .................................................. C23C 16/00
[52] U.S. Cl. ......................... 264/39; 264/1.21; 264/40.1; 264/81; 249/115
[58] Field of Search .............................. 264/81, 39, 1.21, 264/40.1; 249/115

[56] References Cited

U.S. PATENT DOCUMENTS

| | | | |
|---|---|---|---|
| 4,332,751 | 6/1982 | Brassell et al. | 264/28 |
| 4,963,393 | 10/1990 | Goela et al. | 427/248 |
| 4,978,577 | 12/1990 | Purohit et al. | 428/409 |
| 4,990,374 | 2/1991 | Keeley et al. | 427/255.1 |
| 4,997,678 | 3/1991 | Taylor et al. | 427/249 |
| 5,071,596 | 12/1991 | Goela et al. | 264/1.2 |
| 5,175,929 | 1/1993 | Anthony et al. | 29/890.142 |
| 5,314,652 | 5/1994 | Simpson et al. | 264/81 |
| 5,453,233 | 9/1995 | Teverovsky et al. | 264/81 |
| 5,686,195 | 11/1997 | Taylor et al. | 428/698 |

OTHER PUBLICATIONS

Goela, et al., "CVD Replication for Optics Applications" SPIE Proc., 1047, pp. 198–210 (1989).
U.S. application No. 09/072,927, filed May 5, 1998 (no copy enclosed).

Primary Examiner—Jan H. Silbaugh
Assistant Examiner—Stefan Staicovici
Attorney, Agent, or Firm—Gerald K. White

[57] ABSTRACT

Articles having at least one precision replicated surface are formed by chemical vapor deposition on a substrate surface which has been precision shaped and finished as the converse of the desired precision surface of the article. The substrate surface is provided with a thin release coating which adheres to the substrate when the article is removed thereby allowing the substrate to be reused. The method is particularly advantageous for forming the interior surfaces of domes and asymmetrical optical surfaces of zinc sulfide.

18 Claims, 1 Drawing Sheet

PRECISION REPLICATION BY CHEMICAL VAPOR DEPOSITION

This invention was made with Government support from the "Physical Optics Program" sponsored by the Defense Advanced Research Project (DARPA) and administered through the University of Arizona.

BACKGROUND OF THE INVENTION

1. Field of the Invention

This invention relates to the precision replication production of relatively dense, dimensionally precise articles by chemical vapor deposition. The production method involves chemical vapor deposition of the article on a suitable substrate and the subsequent separation of the article having a replicated surface in its essentially final shape and finish from the substrate. Particularly advantageous embodiments of the invention involve the production of optical components or articles such as cones, cylinders, domes, aspheric surfaces and small f-number optics which have steep curvatures. Specific applications of such components include lenses and mirrors for cameras, imaging systems, astronomical telescopes, synchrotrons, conformal domes for missiles and torroidal windows for aircraft. The invention is particularly suitable for producing infrared optical articles of zinc sulfide.

2. Description of Related Art

Chemical vapor deposition (CVD) has been used to provide various materials either in free-standing bulk form or as a layered coating on a substrate. CVD methods of providing zinc sulfide layers and articles are described in commonly assigned U.S. Pat. Nos. 4,978,577 and 5,686,195, and in the references cited therein. Generally, the previous methods of producing bulk material by CVD processing have provided solid shapes, the surfaces of which are then machined to their final article form. Replication techniques for producing "near-net shape parts" which minimize machining are suggested and some results described in Goela et al., "CVD Replication for Optics Applications", *SPIE Proc.*, 1047, pages 198–210 (1989). An improved replication process for producing silicon carbide articles described in U.S. Pat. No. 4,997,678 provides an in situ applied coating of carbon on a polished preshaped substrate prior to initiating the chemical vapor deposition of silicon carbide to form an article replicating a surface of the substrate.

While the techniques described in the prior art have produced near-net shape articles, there continues to be a need for a precision replication technique which will provide precisely shaped articles, such as optical components, without the need for final machining of the optical surfaces. The techniques described in U.S. Pat. No. 4,997,678 provide relatively good replicas, however the carbon rich film used therein is applied in situ at the beginning of each production deposit. Such does not provide an opportunity to measure or otherwise verify the dimensions of the film prior to commencing the production run, and allows uneven growth of the carbon rich film to result in uncontrolled deviations in the replicated article. Moreover, the carbon rich film tends to adhere to the surface of the replica when such is separated from the substrate. These characteristics tend to limit the ability of this technique to replicate the finish of the substrate.

Techniques which provide precision replication of, and facile release from, a substrate are particularly needed. For instance, infrared sensors used for navigation, guidance and targeting on aircraft and missiles require protection from the elements by transmissive windows or domes. Preferably such windows or domes are provided in a shape which minimizes aerodynamic drag while avoiding transmission irregularities. In a missile, the preferred location is in the nose. A spherical dome at this location produces considerable drag which can be significantly reduced by the use of an extended generally conical shaped dome. The fabrication of such a dome, however, is made difficult, or even impossible, when machining of the interior surface of the dome is required since the functionality of the required apparatus decreases as the diameter of the cone decreases and its length is extended. The precision replication of such interior surface of a dome on a reusable mandrel, such that machining or polishing of such surface is not required, would provide significant fabrication advantages. Certain CVD produced bulk materials, such as zinc sulfide and zinc selenide, however, due to their thermal expansion characteristics and those of their preferred mandrel materials, have not previously been produced on the exterior surfaces of a curved male mandrel. Instead, when such materials have been used to produce curved products, they have been fabricated by deposits formed on the interior surfaces of curved female mandrels, whereby the interior surfaces of such curved articles require considerable machining to provide their required final figure and finish.

SUMMARY OF THE INVENTION

The invention provides for precision replication of dimensionally precise articles of dense materials by the chemical vapor deposition of such materials on selected substrates. The technique provides replicated articles which require minimal or no optical fabrication of the replicated surface. Previous techniques of producing shaped materials using CVD resulted in deposits which are of "near-net shape" when removed from the production substrate. These recovered deposits, or articles, generally require machining to final shape, or "figure"; and further machining to final surface smoothness, or "finish". The articles fabricated by the present precision replication technique do not require further machining to their final shape or "figure", and may or may not need minimal buffing to provide the required surface smoothness or "finish".

Precision replication involves selection of an appropriate substrate material and the fabrication therefrom of a substrate, or mandrel, containing a converse surface, or "negative", of the surface of the desired product. The substrate surface is polished to a high degree of surface figure and finish. A thin layer of a release coating is applied to the substrate surface either before placing the substrate in the deposition furnace or in situ in the furnace. The release coating is selected and applied to result in a thin film coating on the substrate which will adhere to the substrate when the substrate and the product replica are separated. In particularly advantageous embodiments the coated substrates are reusable.

The invention also includes various mandrels which are uniquely adapted for use in the described precision replication techniques.

DETAILED DESCRIPTION OF THE INVENTION

Monolithic chemical vapor deposited solid bodies are typically prepared by reacting a chemical precursor material in the presence of a suitable substrate whereby the precursor material reacts causing the desired material to form a deposit on the substrate. The reaction is continued for sufficient time to form a deposit of the desired thickness. Once the desired thickness is deposited the reaction is discontinued and the deposit separated from the substrate. The surfaces of the solid body are then machined to provide the desired article in its final shape, or "figure", and final surface smoothness, or "finish".

Figure 1:
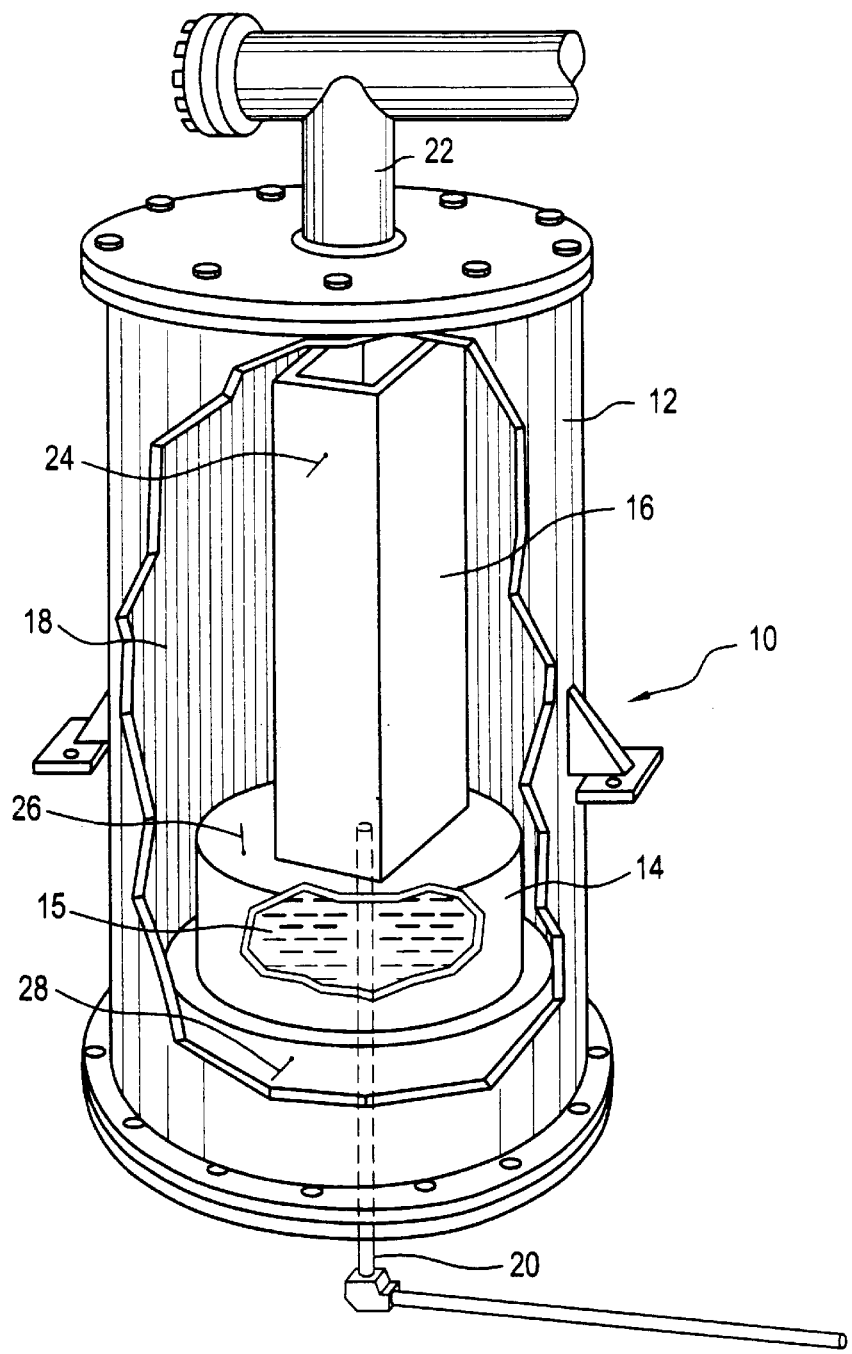
FIG. 1 is a schematic view, partially in section, of a furnace for the chemical vapor deposition of zinc sulfide.

A typical furnace for producing solid bodies of zinc sulfide is illustrated in FIG. 1. The furnace 10 is enclosed in a vertically oriented water cooled stainless steel vacuum chamber housing 12. A graphite retort 14 containing molten zinc 15 and provided with a first heating means, such as resistance and/or radiant heating elements, is provided near the bottom of the chamber 12. A rectangular mandrel 16 is arranged above the zinc retort 14 with its interior in flow communication with the retort. Second heating means 18 capable of heating the mandrel are provided around its exterior. A gas injector 20 provides hydrogen sulfide ($H_2S$) and an inert carrier gas to the lower portion of the mandrel's interior. The gas exhaust 22 at the top of the housing 12 is operatively connected to a filtration system (not shown) to remove particulates, then to a vacuum source, such as a vacuum pump (not shown) and finally to a scrubber (not shown) to remove unreacted $H_2S$ and any other toxic products. The temperature of the mandrel is measured by a thermocouple 24 touching the mandrel at its external surface. The temperature of the zinc in the retort is measured by two thermocouples, one 26 touching the upper portion of the retort's wall (above/near the level of molten zinc) and another thermocouple 28 extending to the lower portion of the retort's wall (below the level of molten zinc).

In operation, the mandrel is brought to an elevated temperature and the pressure in the furnace is reduced. Elemental zinc vaporized in the zinc retort 14 at a first temperature is mixed with the injected $H_2S$ and carrier gas as they enter the mandrel 16. The mixed gases are caused to flow through the interior of the mandrel wherein they contact the heated interior surface of the mandrel and are heated to a second, or substrate, temperature causing the zinc and $H_2S$ to react forming ZnS on the interior surface of the mandrel 16. The carrier gas and any gaseous or entrained reaction products are removed from the chamber at the gas exhaust 22 and processed through the filtration and scrubbing systems. Once started, the process is continued until the desired thickness of zinc sulfide is deposited on the graphite mandrel, which takes more than 15 hours and can take up to 1100 hours, and typically takes between 100 and 600 hours. When the desired thickness is achieved the gas flow through the gas injector 20 is discontinued, the first heating means is turned down, the second heating means 18 is turned off and the pressure within the furnace returned to ambient, the chamber housing 12 is opened and the graphite mandrel 16 is removed. The zinc sulfide sheets deposited on the interior walls of the mandrel are removed therefrom and, if necessary, cut into sheets of the desired size.

The fabrication of the substrate, or mandrel, is critical to the present precision replication procedure. The mandrel should be made of a material which will withstand the high temperature and corrosive environment of the CVD process, is inert to the deposited material, has an appropriate coefficient of thermal expansion (CTE), is durable and can be produced in the required sizes, shapes and degree of finish of interest. Ideally, if the mandrel material has the same CTE as the deposit, it is not necessary to provide CTE corrections in the mandrel shape. When a curved shape article is to be replicated, a "female" mandrel is preferred for those parts having a large aspect ratio. For these purposes, the aspect ratio is defined as the ratio of the part diameter to its height (or length). When the aspect ratio is less than 2 a "male" mandrel is preferred. Separation of the mandrel from the replica is assisted by providing female mandrels having a coefficient of thermal expansion (CTE) which is slightly smaller than that of the deposit whereby the deposit will shrink away from the female mandrel as they cool. Male mandrels having a CTE slightly larger than that of the deposit will shrink away from the deposit as they cool.

The preferred mandrel material for most applications is the same material as the deposit being replicated. Such provides a mandrel having the same CTE as the replica and permits the mandrel to be fabricated at room or any other temperature, independent of the intended deposition temperature, as an exact negative image of the article to be replicated, avoiding any need to provide a CTE correction. However, such deposits on a mandrel of an identical material are usually difficult or impossible to separate from the mandrel. A preferred embodiment of the inventive technique uses mandrels of the same material as that being deposited, the mandrel having a thin release coating of another hard material which separates or releases the deposit more readily than it separates from the mandrel.

The release coating material should (a) withstand the high temperature and corrosive environment of the CVD process, (b) possess minimal stresses capable of altering the figure and finish of the mandrel, (c) completely cover the mandrel surface to be replicated and be free of pinholes, (d) be capable of substantially retaining the figure and finish of the underlying mandrel surface and (e) bond more strongly to the mandrel than to the replicated article. Generally, the best combination of these properties are found in coating materials formed of at least one element chosen from a different group of the Periodic Table than the mandrel/deposit material. For instance, if the mandrel and replicated article are fabricated of zinc sulfide, a compound of elements from the second and sixth groups of the Periodic Table, the best combination of coating properties, particularly the release property, will be found in materials having at least one element selected from Periodic Table groups other than the second and sixth. Metals and oxides are believed to be particularly suitable for use as the release coating material.

The release coating is applied as a thin coating covering the surface to be replicated. The coating may be up to 20 microns thick, and, preferably is 1500 to 3500 Å thick. Care should be exercised to avoid pinholes extending through the coating. Applying the coating as two layers reduces the potential of pinholes extending through the coating. The functionality of some coatings, particularly metallic coatings, can be improved by annealing the coated mandrel.

Typical prior art processes have used graphite mandrels. In these processes, after the sheets are removed from the mandrel, both surfaces of the sheets are machined to remove graphite contaminants and to provide the required figure and finish of the product article. While graphite is a suitable substrate material for the production of near-net shape articles, it is relatively porous and cannot be polished to a high degree of figure and finish. This property, along with its tendency to leave contaminants on the replica's surface, limit graphite to applications for producing near net shape or coarser articles. The mandrels used in the inventive process can be polished to a high degree of finish and can be reused to produce precision replicas, thereby significantly reducing the machining necessary to provide articles of the required figure and finish. The flat mandrels of the inventive technique are generally finished to a flatness of less than 1 wave as indicated by a He—Ne laser having a wavelength of 632.8 nm; preferably the flat mandrels have a flatness of less than 0.4 wave. The flat mandrels are also finished to a surface smoothness of less than 500 angstroms root mean square (RMS) roughness, preferably, less than 100 Å RMS, and, most preferably, less than 30 Å RMS.

The mandrel can be provided in any of the recognized mandrel configurations. It can be provided as a rectangular, circular, or asymmetrically sided hollow box female mandrel similar to that illustrated in FIG. 1. It can be provided as a columnar, conical, spherical or asymmetrical, solid or hollow male mandrel. It can be provided as a flat surface. Preferably, the mandrel is mounted in the furnace in a manner which assures that the deposit forms principally on the surface containing the shape to be replicated, with little or no deposit occurring on the side of mandrel or extending from the mandrel to other surfaces in the furnace. Devices and techniques capable of accomplishing such isolation of the replicated deposit are described in U.S. Pat. Nos. 4,963,393 and 4,990,374 and in copending application Ser. No. 09/072,927, filed May 5, 1998, which are incorporated by reference herein.

Zinc sulfide articles can be produced in a furnace similar to that shown in FIG. 1, wherein part, or all, of the interior surface of rectangular mandrel 16 is formed of zinc sulfide sheets having a surface machined to an RMS surface error of less than a half wave as measured with a He—Ne laser ($\lambda$=632.8 nm), and coated with a layer of alumina about 2000 to 3000 Å thick. The alumina coating is applied by physical vapor deposition technique, such as sputtering, evaporation or plasma assisted processing. The figure and finish of the coated mandrel is measured. If the figure and/or finish is not within specification, the coating is stripped, the stripped mandrel repolished, if necessary, and the coating reapplied. The molten zinc in retort 14 is heated to a temperature between 600° C. and 650° C., the pressure in the furnace reduced to within the range of 30 to 60 torr, and the temperature at the mandrel surface maintained between 670° and 740° C. Argon is used as a carrier gas to assist the transfer of the zinc vapors to the reaction zone adjacent the mandrel surface and hydrogen sulfide is introduced through the central injector. The deposition reaction is continued until the deposit achieves its intended thickness, which can take up to 1100 hours. Once the intended thickness is achieved, the flow of argon and hydrogen sulfide is discontinued, the furnace pressure and mandrel temperature are returned to ambient, the furnace opened, the mandrel removed from the oven and the deposit removed from the mandrel.

Figure 2:
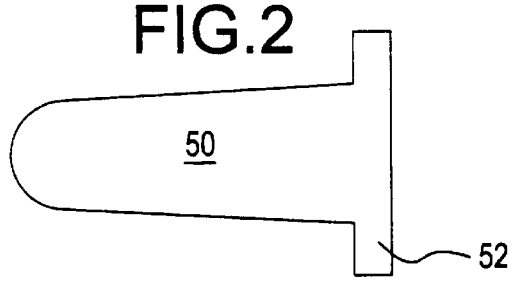
FIG. 2 is a cross section of a representative male mandrel.

A male mandrel suitable for use to produce a tapered cone is illustrated in FIG. 2. The mandrel 50 extends from a mounting plate 52, or base, a distance greater than twice its width at said base, and is tapered as it extends away from said base. The taper, in addition to any other design function, assists the release of the deposit from the mandrel. Excellent replication of a similar alumina coated zinc sulfide male mandrel has been demonstrated in a zinc sulfide deposit having a thickness of approximately 0.45 inches. The deposit released from the mandrel without difficulty.

Further mandrel materials suitable for use with zinc sulfide deposits include tantalum, titanium, aluminum oxide (both alumina and sapphire) and zinc selenide. Tantalum is a further release coating material for use with zinc sulfide deposits. The various mandrel and coating materials found to be useful with zinc sulfide should also be functional for precision replication of zinc selenide deposits. Moreover, the described precision replication technique is applicable to provide articles of other CVD materials, such as aluminum nitride, boron nitride, diamond, silicon, silicon carbide, etc.

It should be understood that the foregoing is provided to enable workers in the art to practice the invention and to describe what is presently believed to be the best mode of practicing he invention. The scope of the invention is defined by the following claims.

I claim:

1. In a process for producing a free standing article of chemical vapor deposited material comprising:
   (a) providing a vapor or gas containing a material precursor,
   (b) reacting said material precursor in the vicinity of a substrate surface whereby said material is deposited on said substrate surface, and
   (c) separating said material as a free standing solid article from said substrate;
   the improvement comprising:
   (d) fabricating said substrate surface as the converse of a surface of said free standing article,
   (e) polishing said substrate surface to a smoothness of less than 500 angstroms root mean square, and
   (f) providing a release coating on said polished substrate surface which adheres to said substrate surface when said material is separated from said substrate enabling the coated substrate to be reused; wherein said free standing article is produced without further machining to a final shape.

2. The process of claim 1 wherein said substrate surface is machined to a figure of less than one wave as indicated by a helium-neon laser ($\lambda$=632.8 nm).

3. The process of claim 1 wherein the substrate is fabricated of the same material as is deposited to form said article.

4. The process of claim 1 wherein said substrate surface comprises an exterior surface of a male mandrel.

5. The process of claim 4 wherein said mandrel is fabricated from a material having a coefficient of thermal expansion which is greater than the coefficient of thermal expansion of said deposited material.

6. The process of claim 1 wherein said substrate surface comprises the interior surface of a female mandrel.

7. The process of claim 6 wherein said mandrel is fabricated from a material having a coefficient of thermal expansion which is smaller than the coefficient of thermal expansion of said deposited material.

8. The process of claim 1 wherein said material comprises zinc sulfide or zinc selenide.

9. The process of claim 8 wherein said substrate surface comprises zinc sulfide or titanium.

10. The process of claim 9 wherein said release coating comprises alumina or tantalum.

11. The process of claim 8 wherein said release coating comprises alumina or tantalum.

12. The process of claim 8 wherein said substrate surface comprises the exterior surface of a male mandrel.

13. The process of claim 1, further comprising
   (f) measuring the figure and finish of the substrate surface containing the release coating provided in accord with step (e) prior to depositing said chemical vapor deposited material on said substrate in accord with step (b).

14. The process of claim 8 wherein said release coating is less than 20 microns thick.

15. The process of claim 1 wherein said substrate surface is polished to a surface smoothness of less than 30 Å root mean square.

16. The process of claim 8 wherein said substrate surface comprises titanium.

17. The process of claim 9 wherein said release coating comprises tantalum.

18. The process of claim 8 wherein said release coating comprises tantalum.

* * * * *